US012740407B2

(12) United States Patent
Lin et al.

(10) Patent No.: US 12,740,407 B2
(45) Date of Patent: Sep. 15, 2026

(54) ELECTRONIC PACKAGE AND MANUFACTURING METHOD THEREOF

(71) Applicant: SILICONWARE PRECISION INDUSTRIES CO., LTD., Taichung City (TW)

(72) Inventors: Hsin-Jou Lin, Taichung City (TW); Lung-Yuan Wang, Taichung City (TW); Feng Kao, Taichung City (TW); Chiu-Ling Chen, Taichung City (TW)

(73) Assignee: SILICONWARE PRECISION INDUSTRIES CO., LTD., Taichung City (TW)

(*) Notice: Subject to any disclaimer, the term of this patent is extended or adjusted under 35 U.S.C. 154(b) by 622 days.

(21) Appl. No.: 17/944,464

(22) Filed: Sep. 14, 2022

(65) Prior Publication Data

US 2023/0178451 A1 Jun. 8, 2023

(30) Foreign Application Priority Data

Dec. 3, 2021 (TW) ................................ 110145273

(51) Int. Cl.
*H10W 40/22* (2026.01)
*H10W 40/00* (2026.01)
(Continued)

(52) U.S. Cl.
CPC ......... *H10W 40/22* (2026.01); *H10W 40/037* (2026.01); *H10W 40/226* (2026.01); *H10W 40/228* (2026.01); *H10W 70/65* (2026.01); *H10W 70/685* (2026.01); *H10W 90/00* (2026.01); *H10W 90/401* (2026.01); *H10W 90/701* (2026.01); *H10W 70/60* (2026.01); *H10W 74/15* (2026.01); *H10W 76/63* (2026.01);
(Continued)

(58) Field of Classification Search
CPC ............. H01L 23/3675; H01L 21/4882; H01L 23/49822; H01L 23/49833; H01L 23/49838; H01L 25/50; H01L 2225/1041; H01L 2225/1094; H01L 2924/16196; H01L 2924/16235; H01L 2924/16251; H10W 40/22; H10W 40/037; H10W 70/65; H10W 70/685; H10W 70/60; H10W 90/288
See application file for complete search history.

(56) References Cited

U.S. PATENT DOCUMENTS 8,558,372 B2 * 10/2013 Negoro ............... H01L 25/0655
257/706
9,978,660 B2 * 5/2018 Hung .................. H01L 23/4334
(Continued)

*Primary Examiner* — Dale E Page
*Assistant Examiner* — Cristian A Tivarus
(74) *Attorney, Agent, or Firm* — Studebaker Brackett PLLC

(57) ABSTRACT

A method of manufacturing an electronic package is provided, in which a package module including a routing structure is stacked on a carrier structure via a plurality of conductive elements, a heat dissipation member covers a part of a surface of the routing structure, and an electronic module is disposed on another part of the surface of the routing structure, so that the routing structure is formed with at least one heat dissipation pad bonded to the heat dissipation member, such that the heat energy of the electronic module and the package module can be dissipated via the heat dissipation pad and the heat dissipation member.

22 Claims, 17 Drawing Sheets

(51) Int. Cl.

| | |
|---|---|
| ***H10W 70/60*** | (2026.01) |
| ***H10W 70/65*** | (2026.01) |
| ***H10W 70/685*** | (2026.01) |
| ***H10W 90/00*** | (2026.01) |
| *H10W 74/15* | (2026.01) |
| *H10W 76/63* | (2026.01) |
| *H10W 90/20* | (2026.01) |

(52) U.S. Cl.

CPC ........ *H10W 90/288* (2026.01); *H10W 90/291* (2026.01); *H10W 90/722* (2026.01); *H10W 90/724* (2026.01); *H10W 90/734* (2026.01)

(56) References Cited

U.S. PATENT DOCUMENTS

| | | | | |
|---|---|---|---|---|
| 10,153,219 | B2 * | 12/2018 | Jeon | H01L 23/5385 |
| 10,840,192 | B1 * | 11/2020 | Zohni | H01L 21/4817 |
| 2012/0028413 | A1 * | 2/2012 | Ha | H10W 90/401 438/107 |
| 2015/0137345 | A1 * | 5/2015 | Choi | H01L 23/04 257/713 |
| 2015/0303174 | A1 * | 10/2015 | Yu | H01L 24/19 438/109 |
| 2016/0133613 | A1 * | 5/2016 | Seo | H01L 23/3677 257/686 |
| 2018/0005984 | A1 * | 1/2018 | Yu | H10W 90/00 |
| 2018/0233459 | A1 * | 8/2018 | Fushimi | H01L 23/34 |
| 2019/0191597 | A1 * | 6/2019 | Han | H01Q 21/0087 |
| 2020/0027809 | A1 * | 1/2020 | Hung | H01L 23/04 |
| 2020/0051899 | A1 * | 2/2020 | Mallik | H01L 23/49816 |
| 2020/0219783 | A1 * | 7/2020 | Kim | H01L 23/5389 |
| 2021/0143787 | A1 * | 5/2021 | Shirasaki | H01L 23/49894 |

* cited by examiner

ELECTRONIC PACKAGE AND MANUFACTURING METHOD THEREOF

BACKGROUND

1. Technical Field

The present disclosure relates to a semiconductor device, and more particularly, to an electronic package and a manufacturing method thereof.

2. Description of Related Art

With the evolution of semiconductor packaging technology, different packaging types have been developed for semiconductor devices. In order to improve electrical functions and save packaging space, different three-dimensional packaging technologies have been developed to integrate integrated circuits with different functions into a single package structure. For example, electronic elements with different functions (such as memory, central processor, graphics processor, image application processor, etc.) are integrated by stacking design to achieve system integration, so as to be applied to thin and light electronic products.

FIG. 1 is a schematic cross-sectional view of a conventional semiconductor package 1. The semiconductor package 1 includes: a first encapsulant 15, a first semiconductor chip 11 embedded in the first encapsulant 15, a circuit structure 10 and a routing structure 14 disposed on opposite sides of the first encapsulant 15, a plurality of conductive pillars 13 embedded in the first encapsulant 15 to electrically connect the circuit structure 10 and the routing structure 14, a plurality of second semiconductor chips 12 disposed on the circuit structure 10 and a second encapsulant 18 covering the second semiconductor chips 12, wherein the routing structure 14 is electrically connected to the first semiconductor chip 11, and the circuit structure 10 is electrically connected to the second semiconductor chips 12, and a plurality of solder balls 19 are formed on the lower side of the routing structure 14 for bonding a circuit board (not shown).

However, in the conventional semiconductor package 1, the heat generated when the first and second semiconductor chips 11, 12 are operating needs to pass through the first and second encapsulants 15, 18 before the heat can be conducted to the circuit board or conducted to the outside, so the heat dissipation effect is not good.

Therefore, how to overcome the above-mentioned drawbacks of the prior art has become an urgent issue to be solved at present.

SUMMARY

In view of the various deficiencies of the prior art, the present disclosure provides an electronic package, comprising: a carrier structure; a package module stacked on the carrier structure via a plurality of conductive elements and including a cladding layer, at least one electronic element and a plurality of conductive pillars embedded in the cladding layer, and a routing structure formed on the cladding layer, wherein the plurality of conductive elements and the routing structure are respectively disposed on opposite sides of the cladding layer, wherein the at least one electronic element and the plurality of conductive pillars are electrically connected to the carrier structure via the plurality of conductive elements, and the routing structure is electrically connected to the plurality of conductive pillars, and wherein the routing structure has at least one heat dissipation pad; a heat dissipation member disposed on the at least one heat dissipation pad and bonded to the carrier structure, wherein the heat dissipation member covers a part of a surface of the routing structure; and at least one electronic module disposed on another part of the surface of the routing structure and electrically connected to the routing structure.

The present disclosure also provides a method of manufacturing an electronic package, comprising: providing a package module including a cladding layer, at least one electronic element and a plurality of conductive pillars embedded in the cladding layer, and a routing structure formed on the cladding layer, wherein the routing structure is electrically connected to the plurality of conductive pillars, and wherein the routing structure has at least one heat dissipation pad; stacking the package module on a carrier structure via a plurality of conductive elements, wherein the plurality of conductive elements and the routing structure are respectively located on opposite sides of the cladding layer, and wherein the at least one electronic element and the plurality of conductive pillars are electrically connected to the carrier structure via the plurality of conductive elements; disposing a heat dissipation member on the at least one heat dissipation pad and bonding the heat dissipation member to the carrier structure, wherein the heat dissipation member covers a part of a surface of the routing structure; and disposing at least one electronic module on another part of the surface of the routing structure, wherein the at least one electronic module is electrically connected to the routing structure.

In the aforementioned electronic package and the manufacturing method thereof, the at least one heat dissipation pad is a dummy pad free from having electrical function.

In the aforementioned electronic package and the manufacturing method thereof, the routing structure has a grounding line, such that the at least one heat dissipation pad serves as a ground pad connected to the grounding line.

In the aforementioned electronic package and the manufacturing method thereof, the routing structure has a plurality of the heat dissipation pads arranged in a ring shape, and the heat dissipation member has a ring body bonded with the plurality of heat dissipation pads, and wherein the ring body has an opening, such that the another part of the surface of the routing structure is exposed from the opening, and the at least one electronic module is disposed on the routing structure in the opening to electrically connect the routing structure. For example, the ring body and the plurality of heat dissipation pads have a heat dissipation material disposed therebetween. Further, the plurality of heat dissipation pads surround the opening to serve as a retaining wall for preventing the heat dissipation material from overflowing to an area of the opening, and the plurality of heat dissipation pads are arranged in multiple rings, and an inner ring and an outer ring are defined according to a distance from the opening, wherein one of the multiple rings closest to the opening is used as the inner ring, and one of the multiple rings farthest from the opening is used as the outer ring, for limiting an arrangement range of the heat dissipation material between the inner ring and the outer ring.

In the aforementioned electronic package and the manufacturing method thereof, the at least one electronic element and the routing structure have a metal layer formed therebetween. For example, the metal layer is in contact with the routing structure. Alternatively, the routing structure has a grounding line to connect the metal layer.

In the aforementioned electronic package and the manufacturing method thereof, the electronic package further comprises a heat dissipation structure disposed on the at least one electronic module.

As can be seen from the above, in the electronic package and the manufacturing method thereof of the present disclosure, the routing structure is designed with a heat dissipation pad, so that the heat energy between the electronic module and the package module can be dissipated along the heat dissipation member via the heat dissipation pad, so as to facilitate the heat dissipation of the electronic module and the package module. Therefore, compared with the prior art, the heat energy of the electronic module and the package module can be easily dissipated to the external environment, not only the heat dissipation path is reduced (or the heat dissipation is fast), but also the heat dissipation effect can be improved via the heat dissipation pad and the heat dissipation member.

DETAILED DESCRIPTIONS

The following describes the implementation of the present disclosure with examples. Those skilled in the art can easily understand other advantages and effects of the present disclosure from the contents disclosed in this specification.

It should be understood that, the structures, ratios, sizes, and the like in the accompanying figures are used for illustrative purposes to facilitate the perusal and comprehension of the contents disclosed in the present specification by one skilled in the art, rather than to limit the conditions for practicing the present disclosure. Any modification of the structures, alteration of the ratio relationships, or adjustment of the sizes without affecting the possible effects and achievable proposes should still be deemed as falling within the scope defined by the technical contents disclosed in the present specification. Meanwhile, terms such as "upper," "first," "second," "one" and the like used herein are merely used for clear explanation rather than limiting the practicable scope of the present disclosure, and thus, alterations or adjustments of the relative relationships thereof without essentially altering the technical contents should still be considered in the practicable scope of the present disclosure.

FIG. 2A to FIG. 2G are schematic cross-sectional views illustrating a manufacturing method of an electronic package 2 according to a first embodiment the present disclosure.

Figure 1:
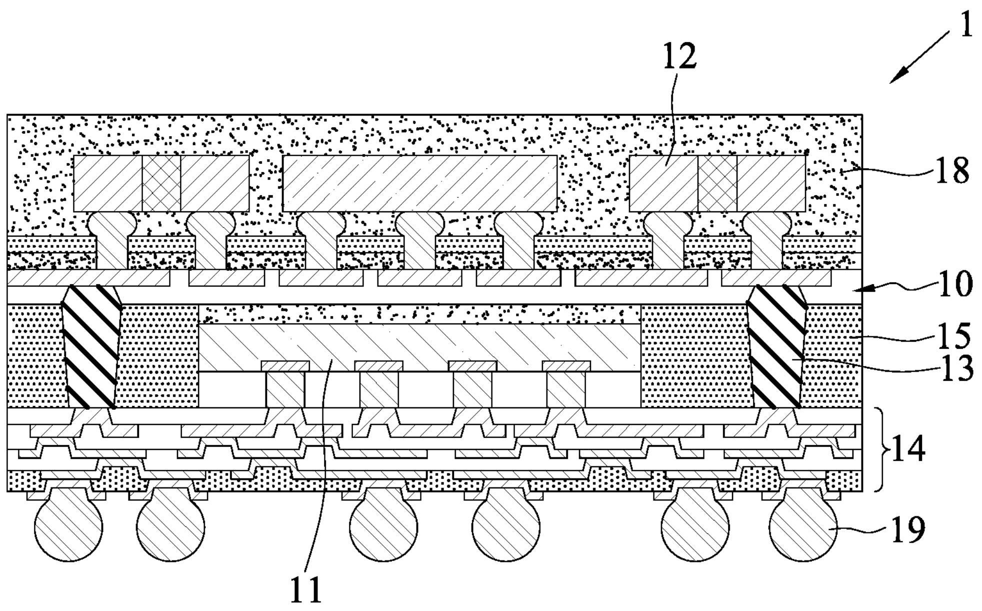
FIG. 1 is a schematic cross-sectional view of a conventional semiconductor package.
Figure 2A:
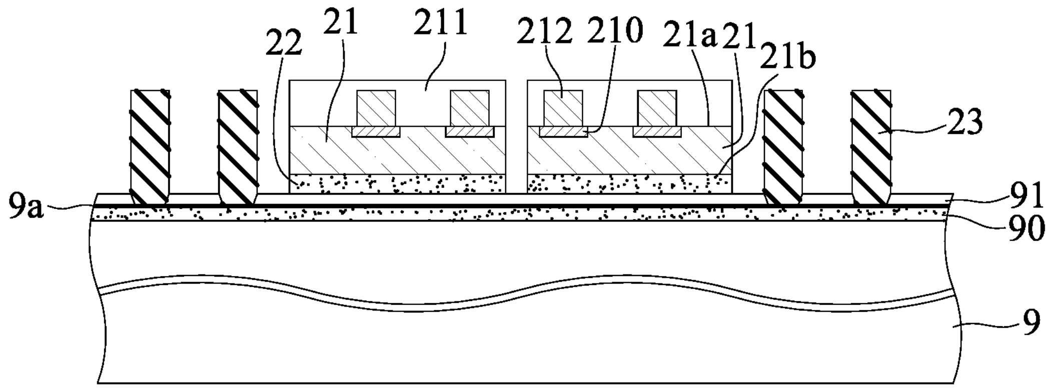
FIG. 2A to FIG. 2H are schematic cross-sectional views illustrating a method for manufacturing an electronic package according to a first embodiment of the present disclosure.

As shown in FIG. 2A, a plurality of conductive pillars 23 are formed on a carrier board 9, and at least one electronic element 21 is disposed on the carrier board 9 (e.g., two electronic elements 21 are shown in FIG. 2A), wherein the electronic element 21 is bonded and electrically connected with a plurality of conductors 212.

In an embodiment, the carrier board 9 is, for example, a board body made of semiconductor material (such as silicon or glass), on which a release layer 90, a seed layer **9*a* such as titanium/copper and an insulating layer 91 such as a dielectric material or a solder resist are sequentially formed by, for example, coating for the conductive pillars 23 to be formed on the seed layer 9*a* (insulating layer 91) by electroplating the seed layer 9*a***.

Furthermore, the material for forming the conductive pillars 23 is a metal material such as copper or a solder material, and the conductors 212 are such as conductive lines, a spherical shape of solder balls, a pillar shape of metal materials such as copper pillars and solder bumps, or stud-shaped conductive members made by a wire bonding machine, but not limited to this.

Also, the electronic element 21 is an active element, a passive element, or a combination of the active element and the passive element, and the active element is such as a semiconductor chip, and the passive element is such as a resistor, a capacitor, or an inductor. In an embodiment, the electronic element 21 is a semiconductor chip, which has an active surface **21*a* and an inactive surface 21*b* opposite to the active surface 21*a*, wherein the electronic element 21 is adhered onto the insulating layer 91 with its inactive surface 21*b* by a bonding layer 22 such as a die attached film (DAF), the active surface 21*a* has a plurality of electrode pads 210 and a protective film 211 such as a passivation material, and the conductors 212 are provided in the protective film 211**.

Figure 2B:
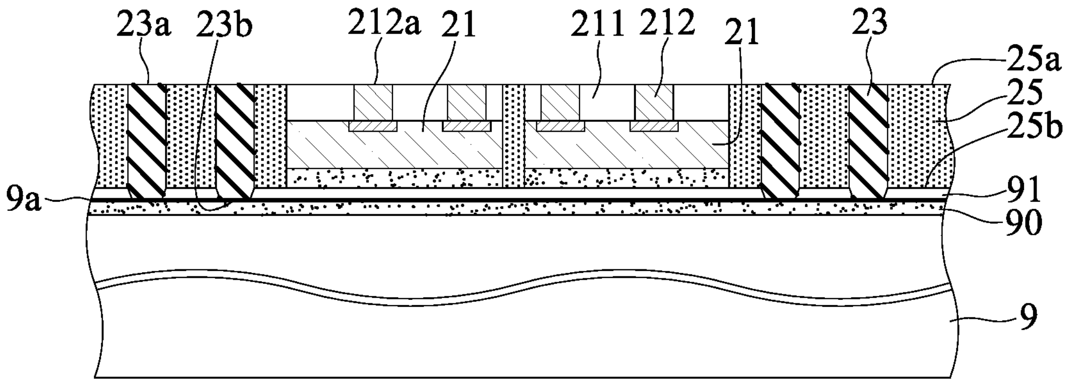

As shown in FIG. 2B, a cladding layer 25 is formed on the insulating layer 91 of the carrier board 9, so that the cladding layer 25 covers the electronic elements 21, the conductors 212 and the conductive pillars 23, wherein the cladding layer 25 has a first surface **25*a* and a second surface 25*b* opposite to the first surface 25*a*, so that the protective film 211, end surfaces 212*a* of the conductors 212 and end surfaces 23*a* of the conductive pillars 23 are exposed from the first surface 25*a* of the cladding layer 25, and the cladding layer 25 is bonded onto the insulating layer 91 of the carrier board 9 with the second surface 25*b*** thereof.

In an embodiment, the cladding layer 25 is an insulating material, such as polyimide (PI), dry film, encapsulant such as epoxy resin, or molding compound. For example, the cladding layer 25 can be formed on the insulating layer 91 by liquid compound, injection, lamination, or compression molding.

Furthermore, the first surface **25*a* of the cladding layer 25 can be flushed with the protective film 211, the end surfaces 23*a* of the conductive pillars 23 and the end surfaces 212*a* of the conductors 212 via a leveling process, so that the end surfaces 23*a* of the conductive pillars 23 and the end surfaces 212*a* of the conductors 212 are exposed from the first surface 25*a* of the cladding layer 25. For example, the leveling process removes part of the material of the protective film 211**, part of the material of the conductive pillars 23, part of the material of the conductors 212 and part of the material of the cladding layer 25 by grinding.

Figure 2C:
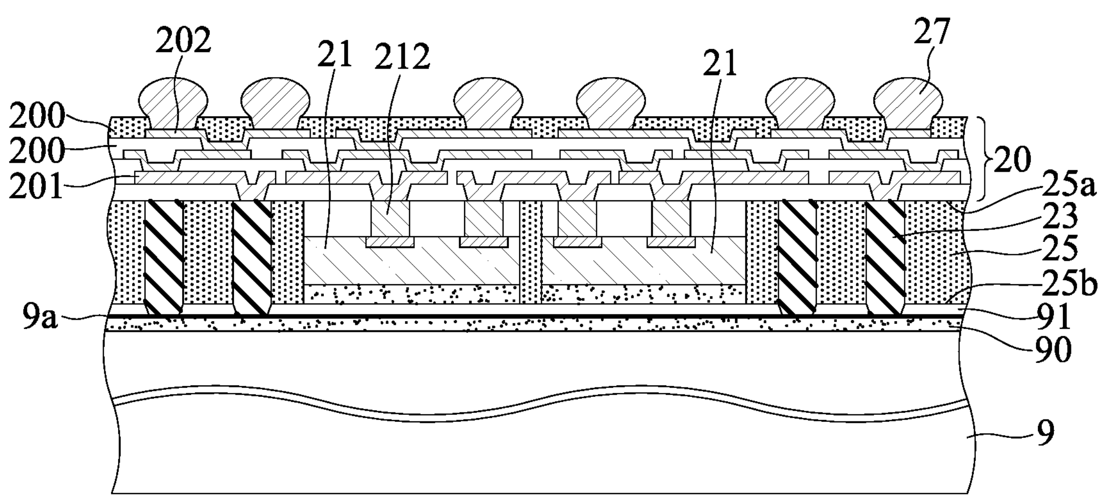

As shown in FIG. 2C, a circuit structure 20 is formed on the first surface 25*a* of the cladding layer 25, and the circuit structure 20 is electrically connected to the plurality of conductive pillars 23 and the plurality of conductors 212.

In an embodiment, the circuit structure 20 includes a plurality of insulating layers 200 and a plurality of redistribution layers (RDLs) 201 disposed on the insulating layers 200, wherein the outermost insulating layer 200 can be used as a solder mask layer, and the outermost redistribution layer 201 is exposed from the solder mask layer to serve as electrical contact pads 202, so that a plurality of conductive elements 27 such as solder bumps, copper bumps or others are formed on the electrical contact pads 202, and the conductive elements 27 are electrically connected to the electrical contact pads 202. Alternatively, the circuit structure 20 may only include a single insulating layer 200 and a single redistribution layer 201.

Furthermore, the material for forming the redistribution layer 201 is copper, and the material for forming the insulating layer 200 is a dielectric material such as polybenzoxazole (PBO), polyimide (PI), prepreg (PP) and the like, or a solder-proof material such as solder mask and graphite.

Furthermore, an Under Bump Metallurgy (UBM) layer (not shown) may be formed on the electrical contact pads 202 to facilitate the bonding of the conductive elements 27.

Figure 2D:
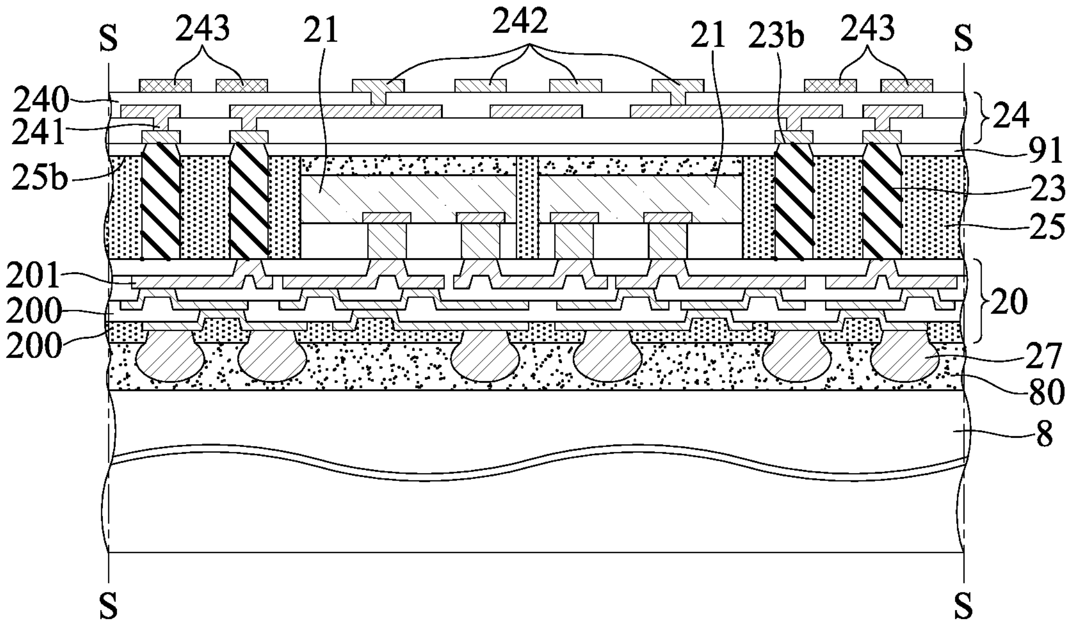

As shown in FIG. 2D, the conductive elements 27 are disposed on a support board 8, and then the carrier board 9 and the release layer 90 and the seed layer 9*a* thereon are removed to expose the insulating layer 91 and the other end surfaces 23*b* of the conductive pillars 23. Next, a routing structure 24 electrically connected to the plurality of conductive pillars 23 is formed on the insulating layer 91.

In an embodiment, the support board 8 is provided with a glue layer 80 thereon, so that the circuit structure 20 is attached to the glue layer 80, such that the conductive elements 27 are embedded in the glue layer 80, and when peeling off the release layer 90, the seed layer 9*a* is used as a barrier to avoid damage to the insulating layer 91, and after removing the carrier board 9 and the release layer 90 thereon, the seed layer 9*a* is then removed by etching. At this time, the other end surfaces 23*b* of the conductive pillars 23 are flush with the insulating layer 91 and exposed from the insulating layer 91.

Furthermore, the routing structure 24 includes the insulating layer 91, at least one dielectric layer 240 and a routing layer 241 bonded with the dielectric layer 240. For example, the material for forming the dielectric layer 240 is a dielectric material such as polybenzoxazole (PBO), polyimide (PI), prepreg (PP), or the like, and the routing layer 241 and the dielectric layer 240 may be formed by a redistribution layer (RDL) process.

Furthermore, a plurality of functional pads 242 electrically connected to the routing layer 241 and at least one heat dissipation pad 243 with no electrical function are disposed on the outermost dielectric layer 240. For example, the heat dissipation pads 243 are arranged in a ring shape (as shown in FIG. 2I) to surround the functional pads 242.

In addition, the heat dissipation pads 243 are dummy pads in a floating state, which electrically insulate the routing layer 241.

Figure 2E:
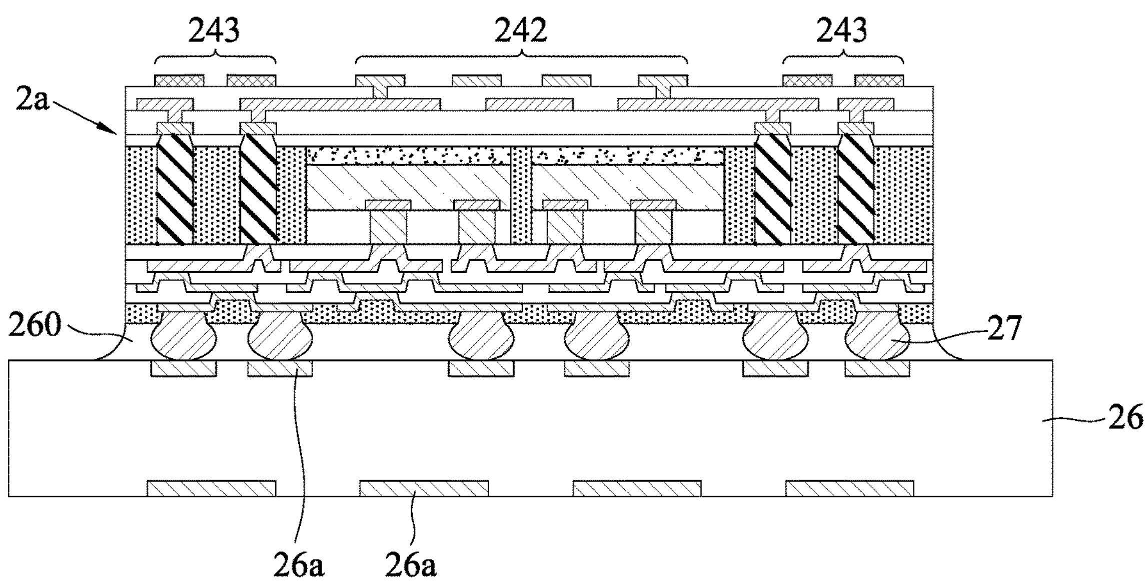

As shown in FIG. 2E, the support board 8 is removed, and then a singulation process is performed along cutting paths S shown in FIG. 2D to obtain a plurality of package modules 2*a*. Afterwards, the package module 2*a* is disposed on a carrier structure 26 via its conductive elements 27.

In an embodiment, the carrier structure 26 is, for example, a package substrate with a core layer or a coreless package substrate, the carrier structure 26 has an insulating base and a circuit layer 26*a* bonded with the insulating base, and the circuit layer 26*a* is, for example, a fan-out redistribution layer (RDL). For example, the material for forming the circuit layer 26*a* is copper, and the material for forming the insulating base is a dielectric material such as polybenzoxazole (PBO), polyimide (PI), prepreg (PP) and the like. It should be understood that the carrier structure can also be other carrier units capable of carrying electronic elements, such as a lead frame or a silicon interposer, which is not limited to the above.

Furthermore, the conductive elements 27 are bonded onto the circuit layer 26*a* to electrically connect the circuit layer 26*a*. For example, an underfill 260 may be formed between the package module 2*a* and the carrier structure 26 to cover the conductive elements 27.

Figure 2F:
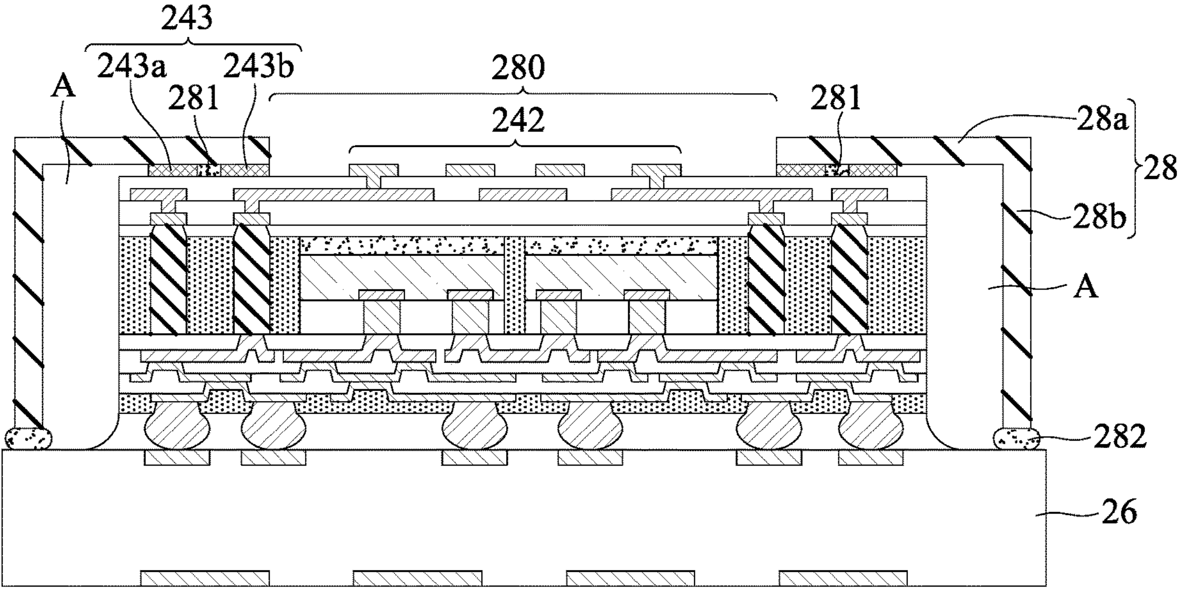

As shown in FIG. 2F, a heat dissipation member 28 is disposed on the heat dissipation pads 243 of the package module 2*a*, and the heat dissipation member 28 is further bonded with the carrier structure 26.

In an embodiment, the heat dissipation member 28 has a ring body 28*a* and a plurality of supporting legs 28*b* extending downward from the edge of the ring body 28*a*, and the ring body 28*a* is in the form of a heat dissipation sheet, and the lower side of the ring body 28*a* is bonded with the heat dissipation pads 243 by a heat dissipation material 281. For example, the heat dissipation material 281 is a thermal interface material (TIM), solder material, metal material, or other thermal conductive material, and the ring body 28*a* has an opening 280, which corresponds to the positions of the functional pads 242, so that the functional pads 242 are exposed from the opening 280. It should be understood that the heat dissipation material 281 can be coated on the heat dissipation member 28 and/or the heat dissipation pads 243 according to requirements.

Furthermore, the supporting legs 28*b* are bonded onto the carrier structure 26 by an adhesive layer 282. For example, the supporting legs 28*b* are free from being in contact with the package module 2*a*, so that a cavity A is formed between the supporting legs 28*b* and the package module 2*a*.

Figure 2G:
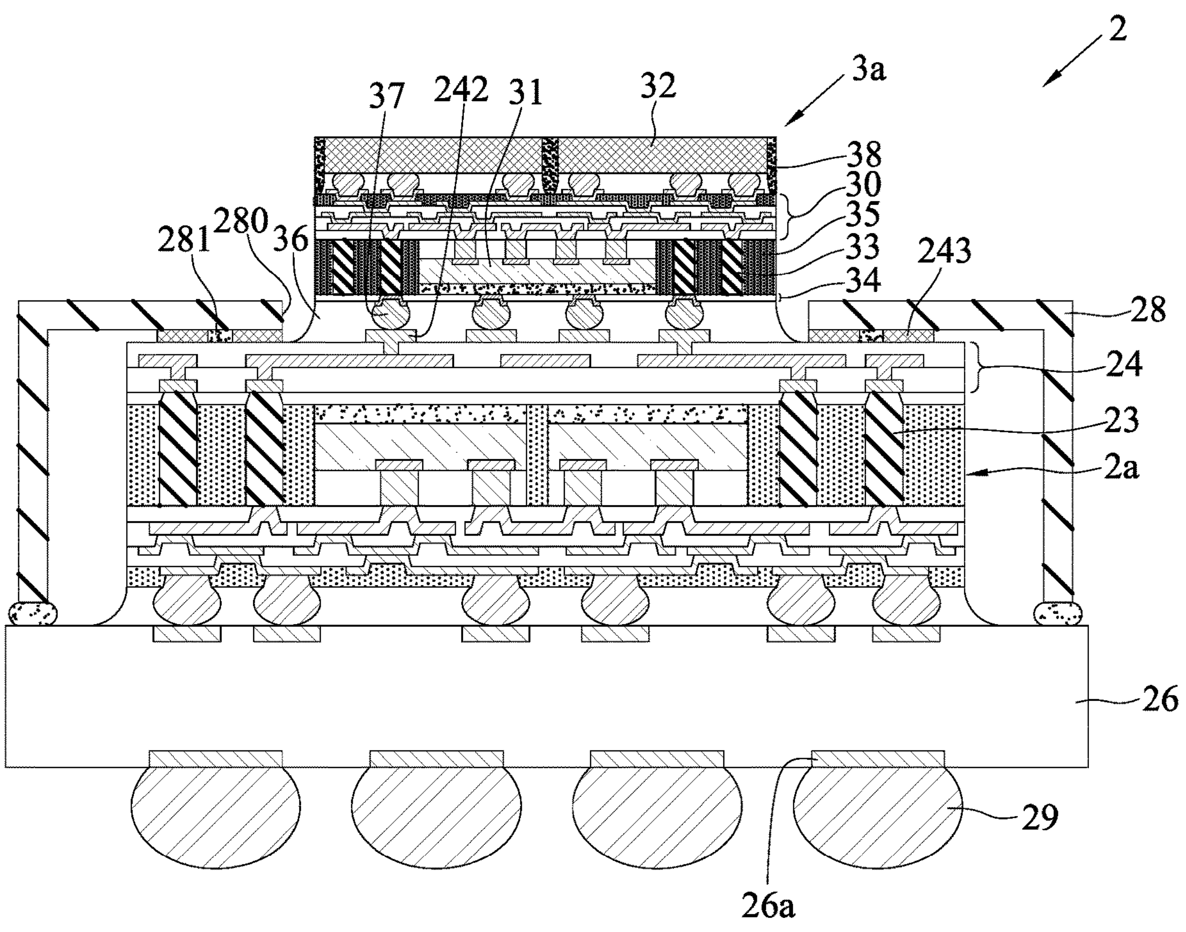
Figure 2H:
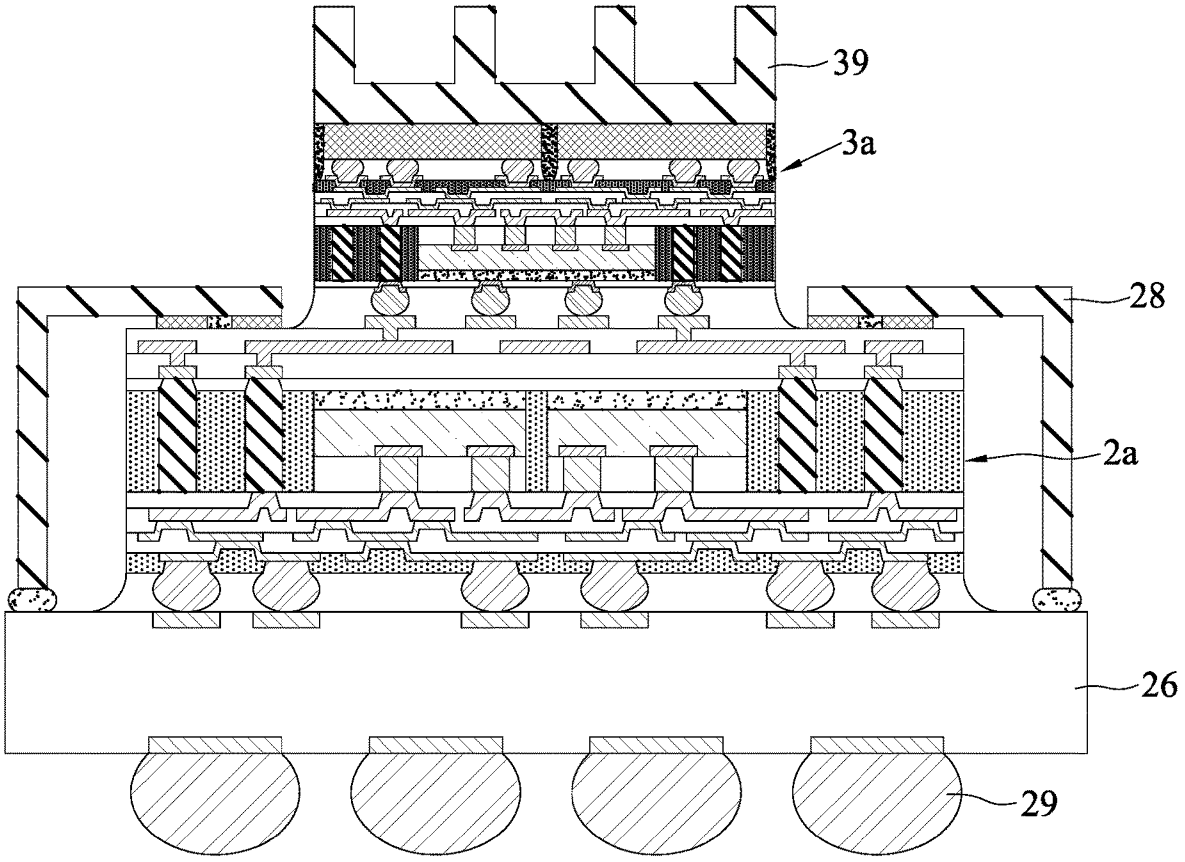
Figure 2I:
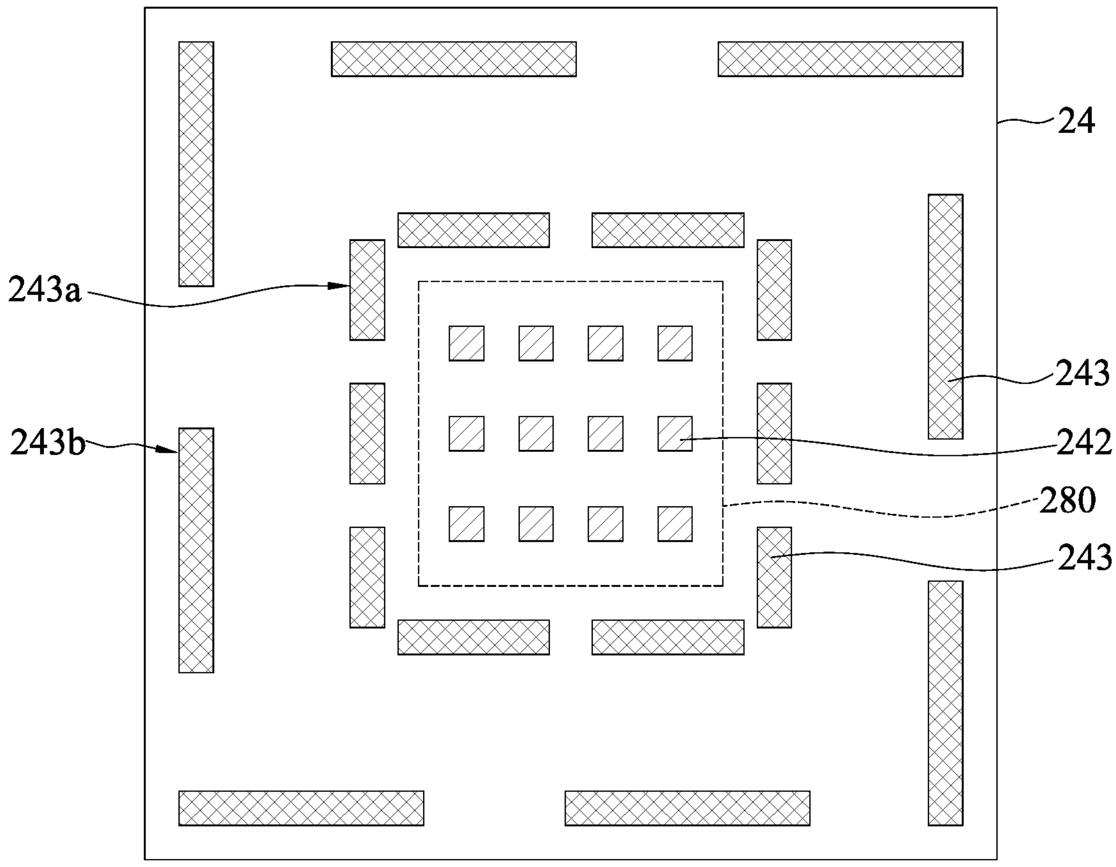
FIG. 2I is a schematic partial top view of FIG. 2F.
Figure 2J:
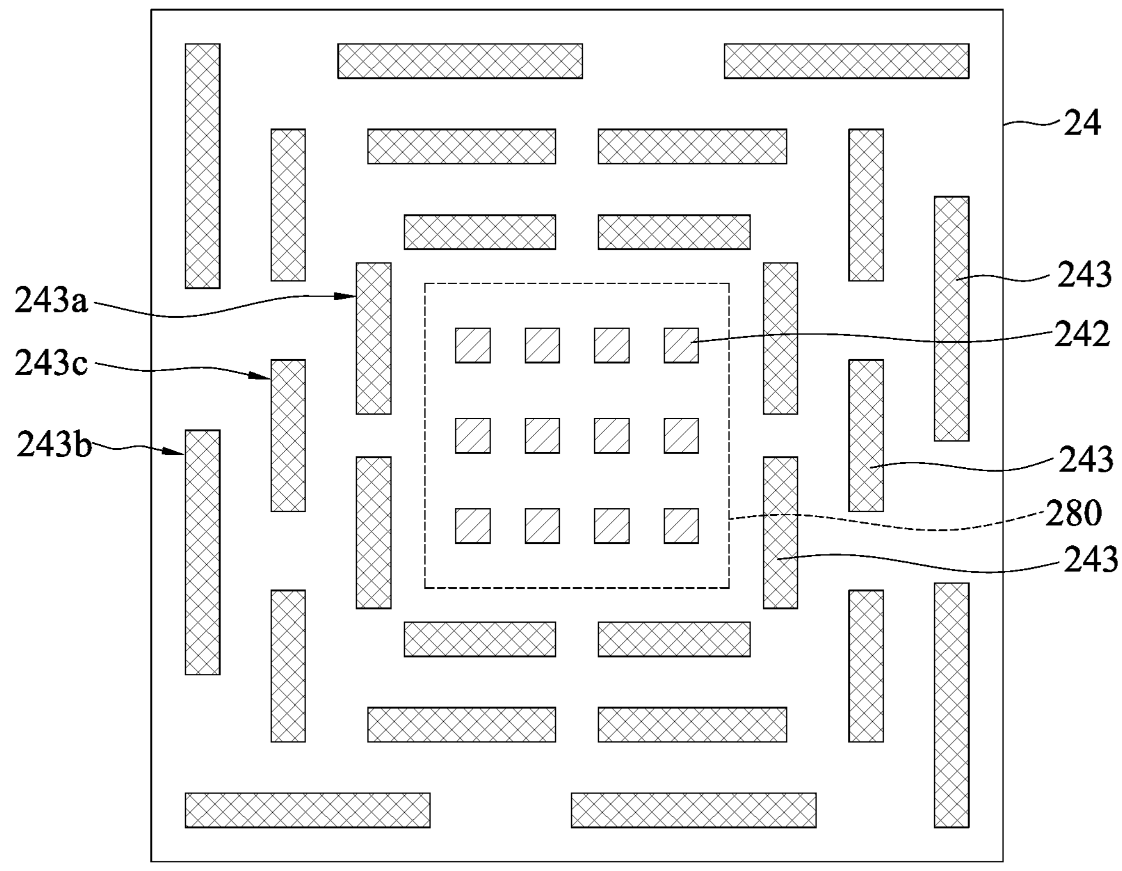
FIG. 2J and FIG. 2K are schematic partial top views of different aspects of FIG. 2I.
Figure 2K:
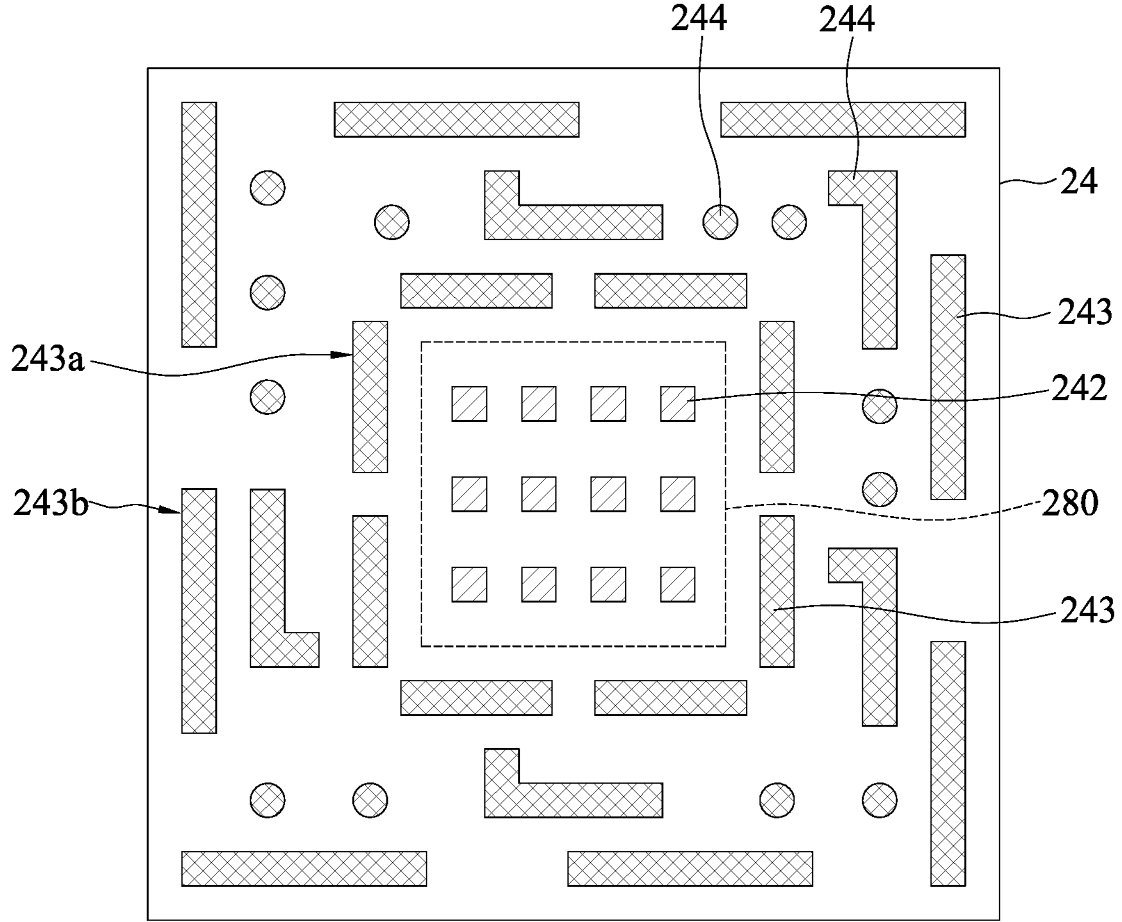

In addition, the shape of the heat dissipation pads 243 can be elongated (as shown in FIG. 2I or FIG. 2J), circular (heat dissipation pads 244 shown in FIG. 2K), L-shaped (heat dissipation pads 244 shown in FIG. 2K), or other geometric shapes, and they can be arranged in a single ring (not shown) or multiple rings (double ring type as shown in FIG. 2I or triple ring type as shown in FIG. 2J) according to the heat dissipation requirements. For example, the heat dissipation pads 243 define an inner ring 243*a* and an outer ring 243*b* according to the distance from the opening 280 by the multi-ring arrangement, as shown in FIG. 2I or FIG. 2J, wherein one of the multiple rings closest to the opening 280 is used as the inner ring 243*a*, and one of the multiple rings farthest from the opening 280 is used as the outer ring 243*b*, for limiting the arrangement range of the heat dissipation material 281 between the inner ring 243*a* and the outer ring 243*b*, so that the heat dissipation material 281 such as underfill or TIM does not overflow to other areas. It should be understood that the arrangement of the heat dissipation pads 243 between the inner ring 243*a* and the outer ring 243*b* can be designed according to requirements and is not limited to a ring shape (such as a middle ring 243*c* shown in FIG. 2J), for example, it can be arranged randomly (such as the heat dissipation pads 244 shown in FIG. 2K) or according to the distribution of heat energy. Therefore, if there is no need to limit the arrangement range of the heat dissipation material 281, the arrangement of the heat dissipation pads 243, 244 can be designed according to requirements and is not limited to a ring shape.

In addition, the inner ring 243*a* surrounds the opening 280, so it can be used as a retaining wall to prevent the heat dissipation material 281 from overflowing to the opening 280 and affecting the heat dissipation effect.

As shown in FIG. 2G, at least one electronic module 3*a* is disposed on the functional pads 242 in the opening 280, so that the electronic module 3*a* is electrically connected to the functional pads 242. Next, a ball-placement process is performed on the circuit layer 26*a* on the lower side of the carrier structure 26 to form a plurality of conductive elements 29 such as solder balls, so that, in the subsequent process, the carrier structure 26 and the conductive elements 29 on the lower side thereof are arranged on a circuit board (not shown), so as to obtain the electronic package 2 of the present disclosure.

In an embodiment, the electronic module 3*a* is electrically connected to the routing structure 24 by bonding the functional pads 242 via a plurality of conductive elements 37 such as solder bumps, copper bumps or others. For example, the conductive elements 37 can be covered by a bonding material 36 such as underfill or non-conductive paste (NCP). Therefore, the inner ring 243*a* formed by the heat dissipation pads 243 can also prevent the bonding material 36 of underfill or non-conductive paste (NCP) from overflowing under the heat dissipation member 28 to avoid affecting the heat dissipation effect.

Moreover, if the bonding material 36 of non-conductive paste (NCP) is used, the NCP is firstly adhered onto the conductive elements 37 and their surroundings, and then the functional pads 242 are bonded. Alternatively, if the bonding material 36 of underfill is used, the conductive elements 37 are first bonded to the functional pads 242, and then a glue dispensing operation is performed to form the bonding material 36.

Furthermore, the electronic module 3*a* includes a first package layer 35, at least one first semiconductor chip 31 embedded in the first package layer 35, a plurality of conductive structures 33 embedded in the first package layer 35, a first circuit portion 30 disposed on the upper side of the first package layer 35, at least one second semiconductor chip 32 disposed on the first circuit portion 30, a second package layer 38 covering the second semiconductor chip 32, and a second circuit portion 34 disposed on the lower side of the first package layer 35 for bonding the conductive elements 37.

In addition, the first semiconductor chip 31 and the second semiconductor chip 32 are electrically connected to the first circuit portion 30, and the conductive structures 33 are electrically connected to the first and second circuit portions 30, 34, and the first package layer 35 and the second package layer 38 are insulating materials such as polyimide (PI), dry film, encapsulant such as epoxy resin, or molding compound. For example, the material of the first package layer 35 may be the same or different from the material of the second package layer 38.

It should be understood that the electronic module 3*a* has various aspects, and the required electronic modules can be configured according to the requirements of the electronic package 2, which is not limited to the above.

Therefore, in the manufacturing method of the present disclosure, the routing structure 24 between the electronic module 3*a* and the package module 2*a* is configured with at least one heat dissipation pad 243 for docking the heat dissipation member 28, so as to facilitate the heat dissipation of the electronic module 3*a* and the package module 2*a*. Therefore, the heat energy of the electronic module 3*a* and the package module 2*a* concentrated in the central area (i.e., the opening 280) can be dissipated to the external environment via the contact of the heat dissipation member 28 with the heat dissipation pad 243.

Furthermore, the heat dissipation member 28 is directly disposed above the conductive pillars 23 and the routing structure 24, not only the heat dissipation path is reduced (or the heat dissipation is fast), but also the heat dissipation effect can be improved via the heat dissipation pads 243 and the heat dissipation member 28 that are of metal materials.

In addition, a heat dissipation structure 39 can also be disposed above the electronic module 3*a* (the top surface of the second package layer 38 or the top surface of the second semiconductor chip 32), such as a fin type heat dissipation piece shown in FIG. 2H, so as to connect a heat dissipation mechanism that utilizes a system side of an electronic product made of the electronic package 2.

Figure 3A:
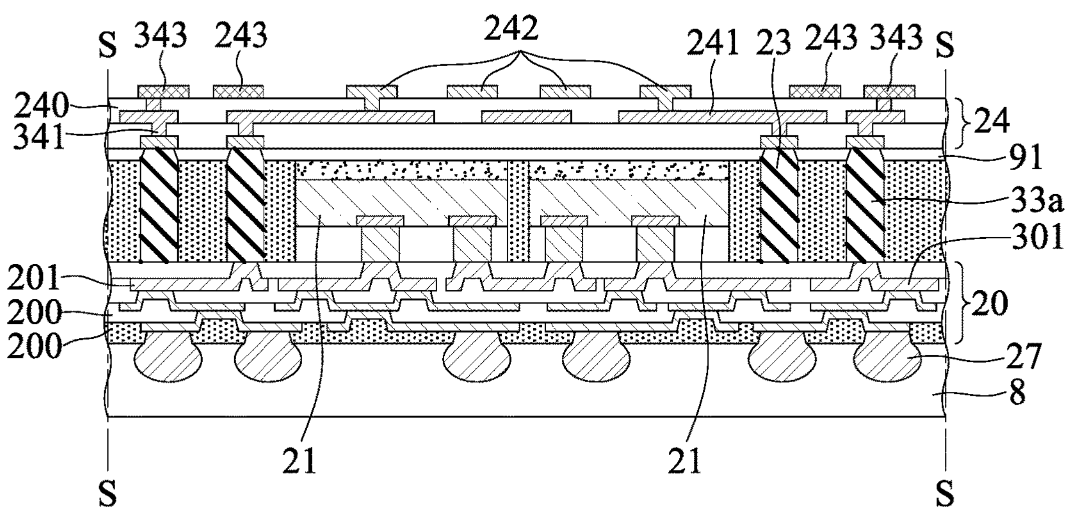
FIG. 3A to FIG. 3B are schematic cross-sectional views illustrating a manufacturing method of an electronic package according to a second embodiment of the present disclosure.
Figure 3B:
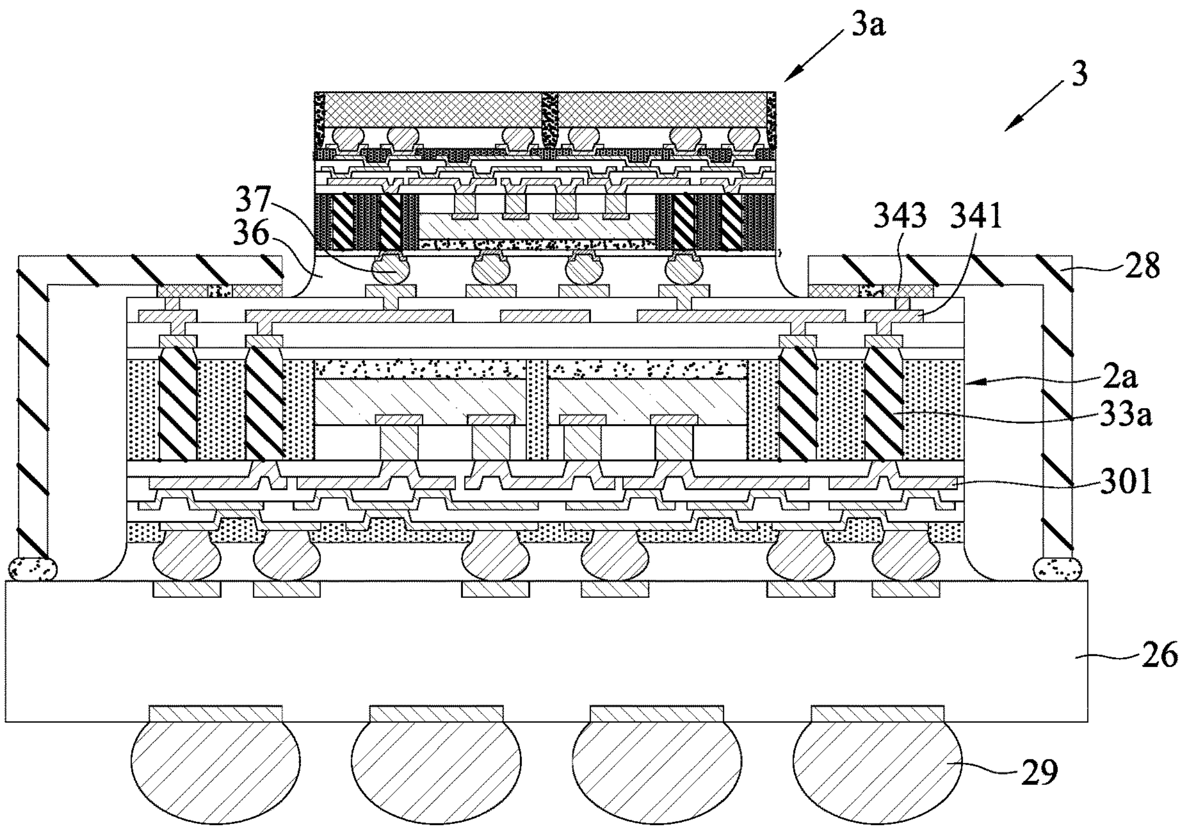

FIG. 3A to FIG. 3B are schematic cross-sectional views illustrating a manufacturing method of an electronic package 3 according to a second embodiment of the present disclosure. The difference between the second embodiment and the first embodiment lies in the configuration of heat dissipation pads 343, so the same points will not be repeated below.

As shown in FIG. 3A, in the process shown in FIG. 2D, the routing structure 24 further includes a grounding line 341 bonded to the dielectric layer 240, and the grounding line 341 can be fabricated together with the routing layer 241 by a redistribution layer (RDL) process, so that the heat dissipation pads 343 are connected to the grounding line 341.

In an embodiment, the heat dissipation pads 343 are used as ground pads, and at least one conductive pillar 33*a* among the plurality of conductive pillars 23, 33*a* is connected to the grounding line 341 and conducts to a part of the redistribution layer 301 of the circuit structure 20 to serve as a heat dissipation path.

As shown in FIG. 3B, the processes shown in FIG. 2E to FIG. 2G are performed to obtain the electronic package 3.

Therefore, compared with the heat dissipation pad 243 of the first embodiment, which provides an upward heat dissipation path via the ring body 28*a*, the heat dissipation pad 343 (ground pads) of the second embodiment is connected to the routing layer 241 for grounding (i.e., the grounding line 341) of the routing structure 24, so that the routing structure 24 and the conductive pillar 33*a* conduct heat to the carrier structure 26, such that the heat dissipation pad 343 (ground pad) provides another downward heat dissipation path.

Figure 4A:
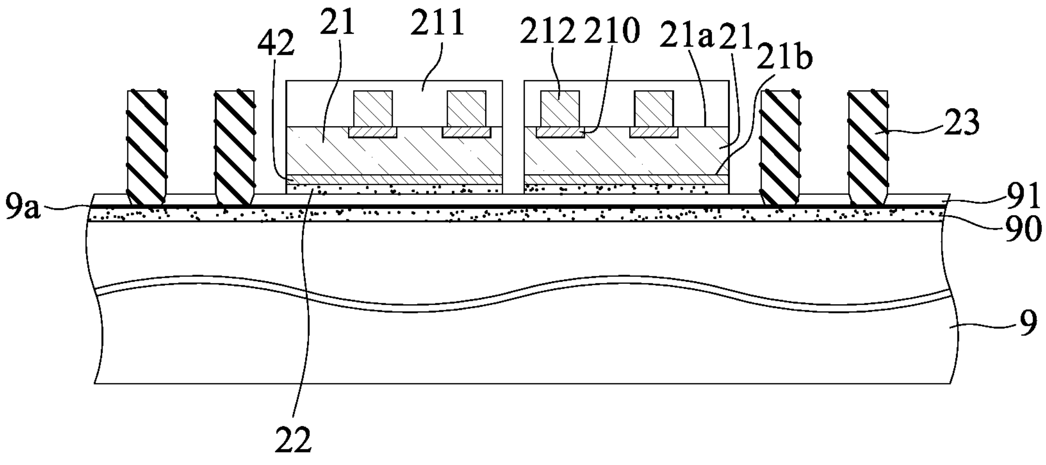
FIG. 4A to FIG. 4C are schematic cross-sectional views illustrating a manufacturing method of an electronic package according to a third embodiment the present disclosure.
Figure 4B:
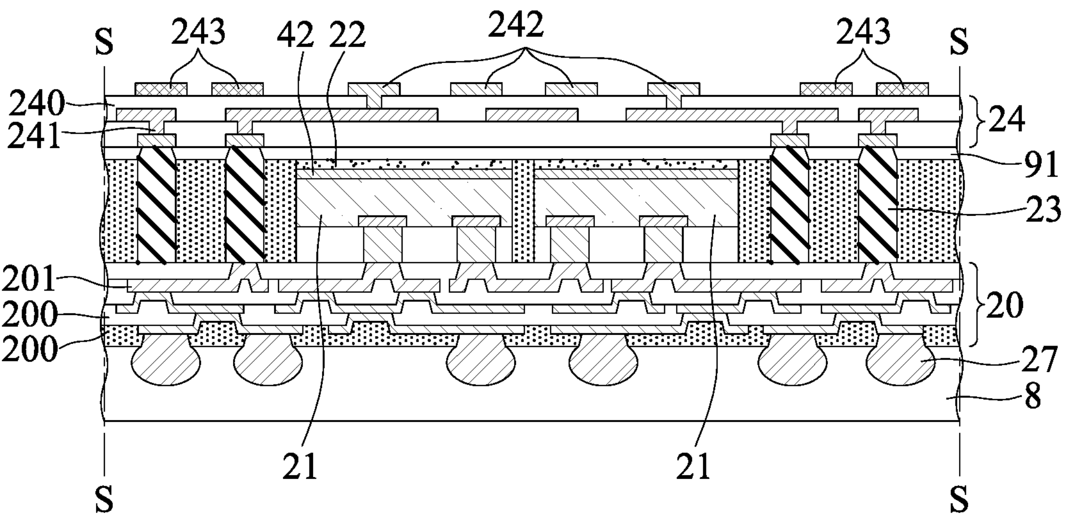
Figure 4C:
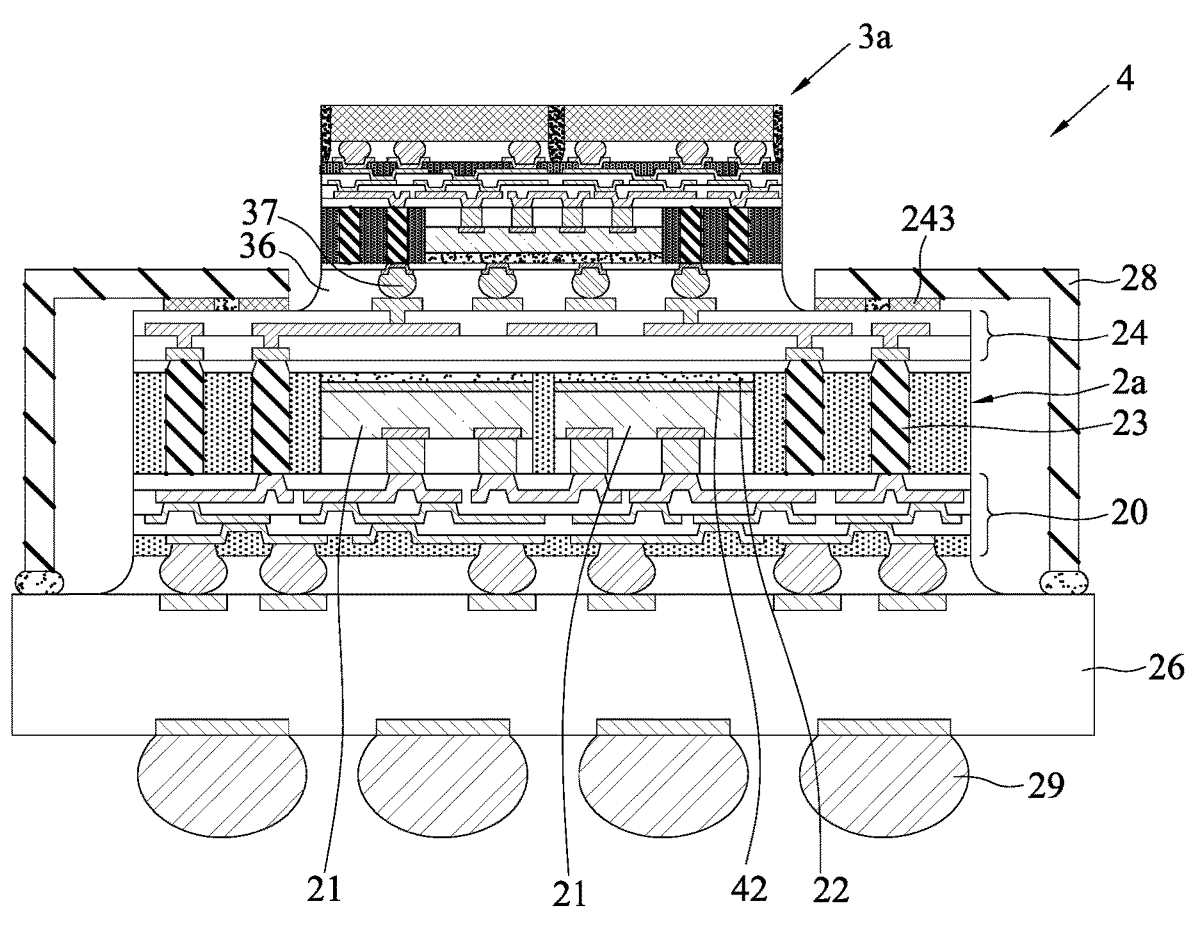

FIG. 4A to FIG. 4C are schematic cross-sectional views illustrating a manufacturing method of an electronic package 4 according to a third embodiment of the present disclosure. The difference between the third embodiment and the first embodiment is that a heat dissipation mechanism is added, so the same points will not be repeated below.

As shown in FIG. 4A, in the process shown in FIG. 2A, the inactive surface 21*b* of the electronic element 21 is bonded onto the insulating layer 91 by a composite material (e.g., a bonding layer 22 and a metal layer 42).

In an embodiment, the material of the metal layer 42 can be a metal material with good heat dissipation capability, such as copper. For example, a metal layer 42 can be sputtered on the inactive surface 21*b* of the electronic element 21, and then a bonding layer 22 can be adhered on the metal layer 42, so that the electronic element 21 can be bonded to the insulating layer 91 via the bonding layer 22.

As shown in FIG. 4B, the processes shown in FIG. 2B to FIG. 2D are performed, wherein the bonding layer 22 and the metal layer 42 are disposed between the routing structure 24 and the electronic element 21.

As shown in FIG. 4C, the processes shown in FIG. 2E to FIG. 2G are performed to obtain the electronic package 4, wherein the heat generated by the electronic element 21 can be transferred to the routing structure 24 via the metal layer 42, and then dissipated via the heat dissipation member 28 on the routing structure 24.

Figure 4D:
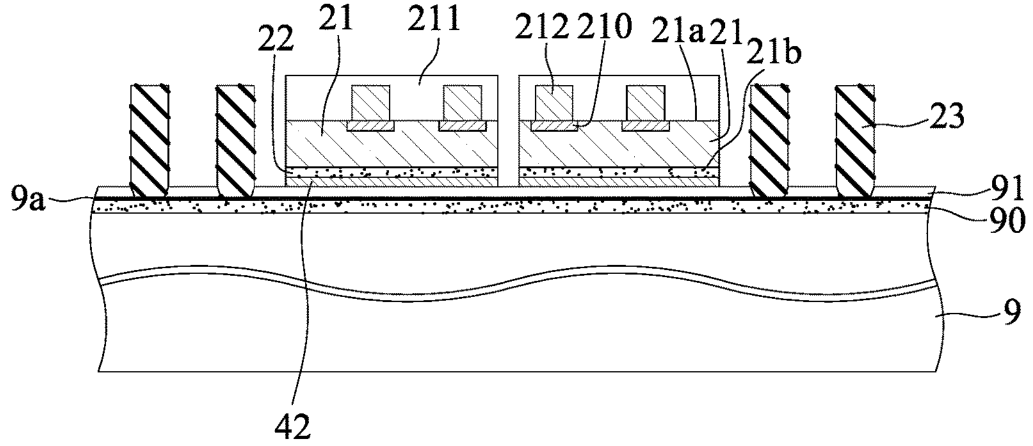
FIG. 4D to FIG. 4E are schematic cross-sectional views corresponding to another embodiment of FIG. 4A to FIG. 4C.
Figure 4E:
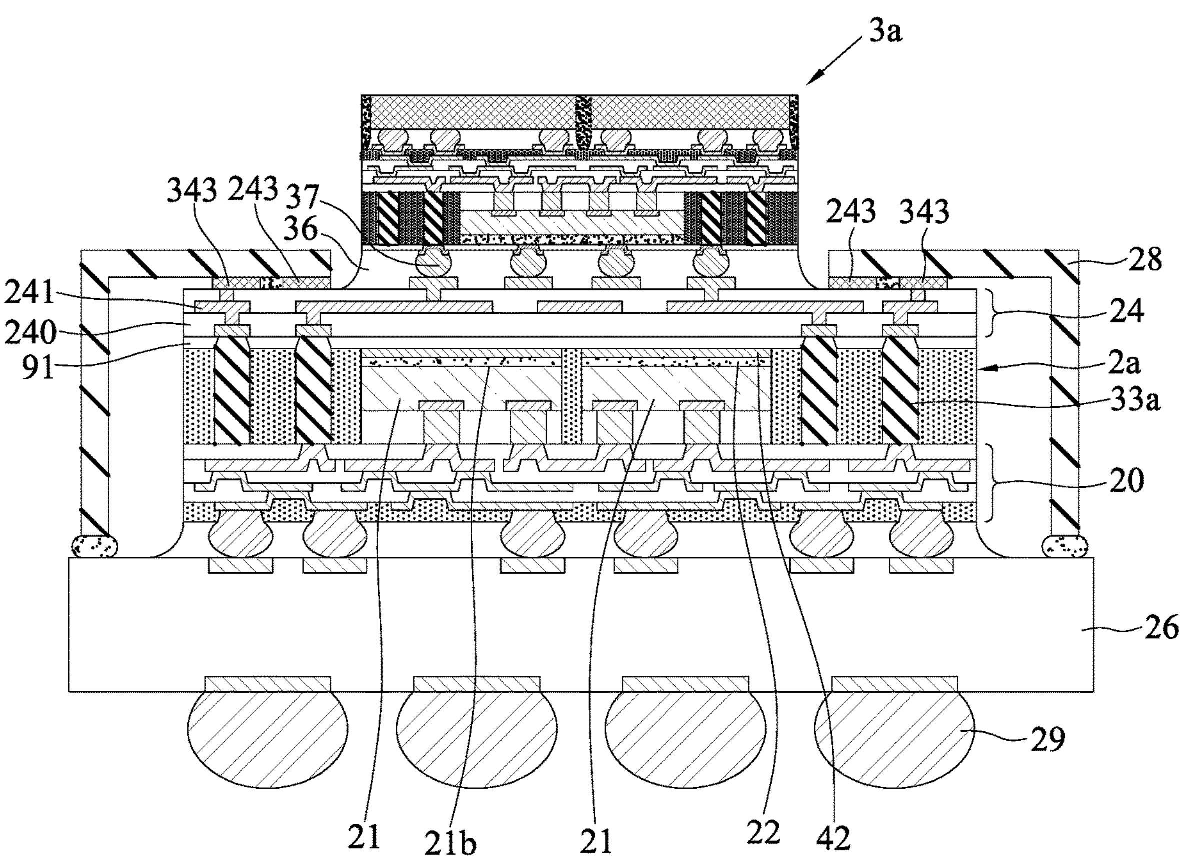

In an embodiment, the composite material can also be that the metal layer 42 is firstly sputtered on the insulating layer 91, and then the bonding layer 22 is formed on the inactive surface 21*b* of the electronic element 21, so that the electronic element 21 is bonded onto the metal layer 42 via the bonding layer 22, as shown in FIG. 4D. For example, the metal layer 42 can be also fabricated when the conductive pillars are fabricated. Therefore, in the subsequent process, the routing structure 24 can contact the metal layer 42, as shown in FIG. 4E, so that the heat dissipation path of the electronic element 21 can pass through the inactive surface 21*b*, the bonding layer 22, the metal layer 42, the insulating layer 91, the routing structure 24 (dielectric layer 240 or routing layer 241), the heat dissipation pads 243, 343, the heat dissipation member 28 (or the conductive pillar 33*a*), the circuit structure 20 and the carrier structure 26.

Figure 4F:
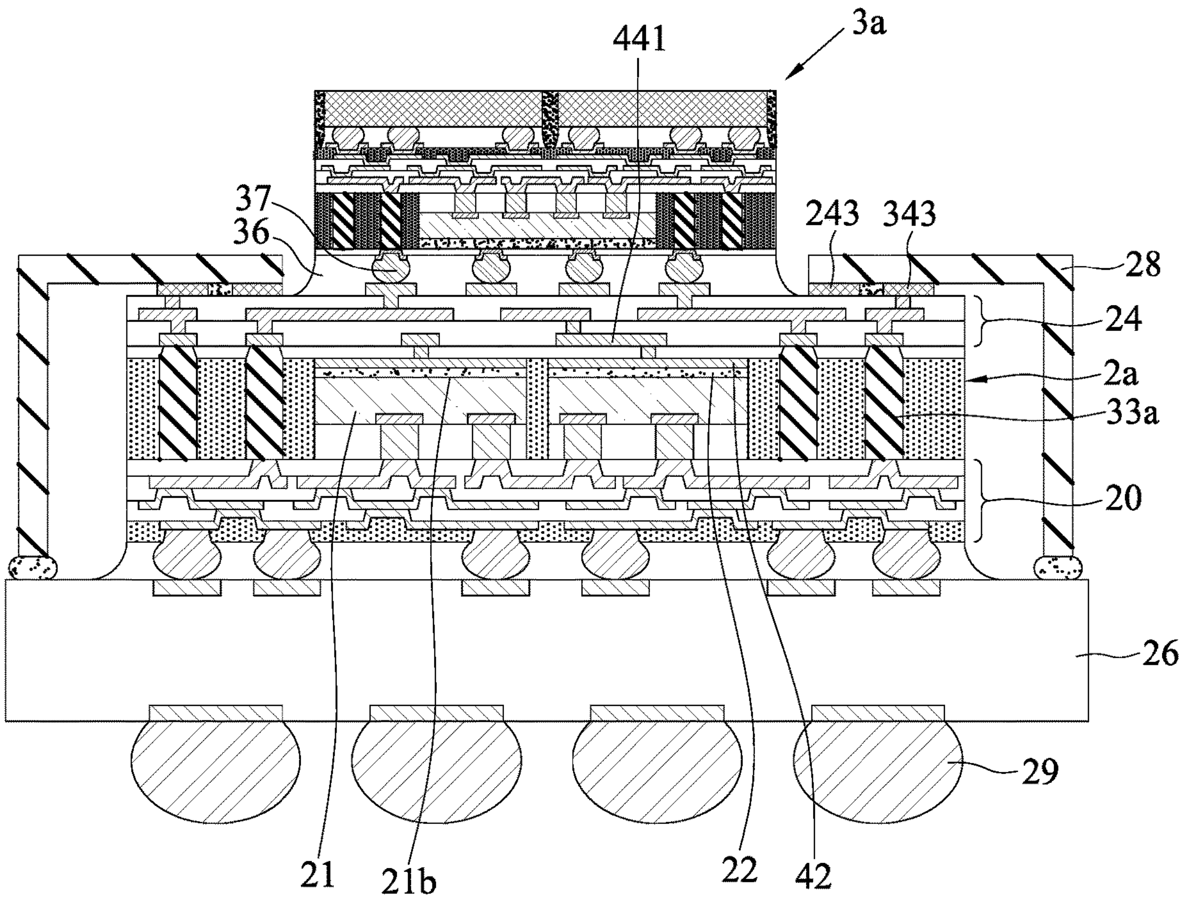
FIG. 4F is a schematic cross-sectional view corresponding to another embodiment of FIG. 4D to FIG. 4E.

Further, the routing structure 24 can also be configured with a grounding line 441 to directly connect the metal layer 42, as shown in FIG. 4F. For example, the grounding line 441 can be fabricated together with the routing layer 241 using a redistribution layer (RDL) process. Therefore, the heat dissipation path of the electronic element 21 can pass through the inactive surface 21*b*, the bonding layer 22, the metal layer 42, the routing structure 24 (grounding line 441), the heat dissipation pads 243, 343, the heat dissipation member 28 (or the conductive pillars 33*a*), the circuit structure 20 and the carrier structure 26, so as to improve the heat dissipation effect.

Therefore, in the manufacturing method of the embodiment, the metal layer 42 is added on the inactive surface 21*b* of the electronic element 21 to enhance the heat dissipation effect of the electronic element 21 (backside), and the metal layer 42 can be further connected to the grounding line 441 of the routing structure 24, so that the path that heat is dissipated to the heat dissipation pads 243 and 343 via the metal layer 42 adopts a high heat dissipation metal path, so the heat dissipation effect is better.

Figure 5A:
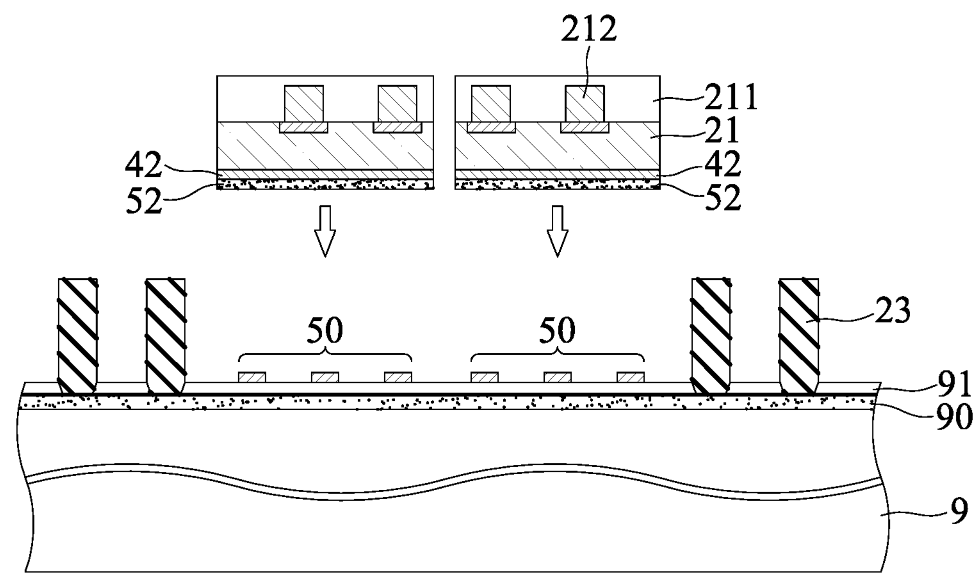
FIG. 5A to FIG. 5C are schematic cross-sectional views illustrating a manufacturing method of an electronic package according to a fourth embodiment the present disclosure.
Figure 5B:
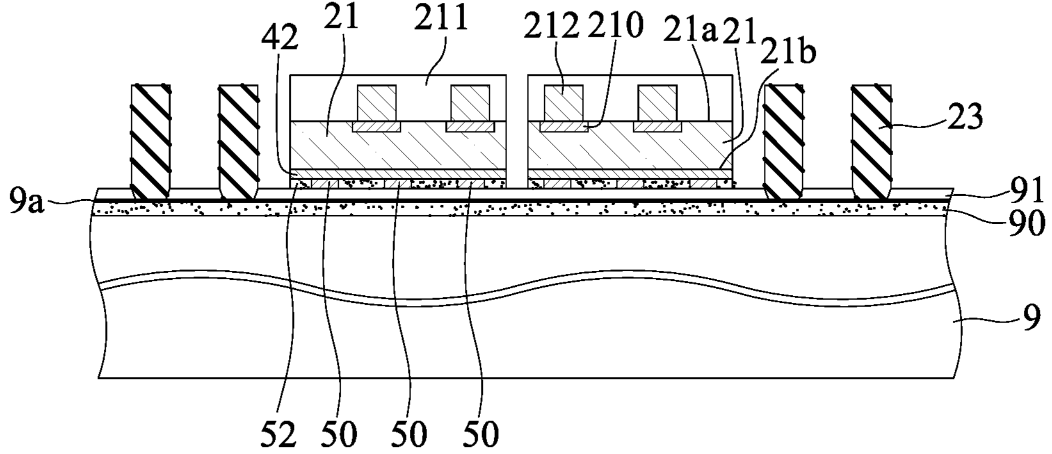
Figure 5C:
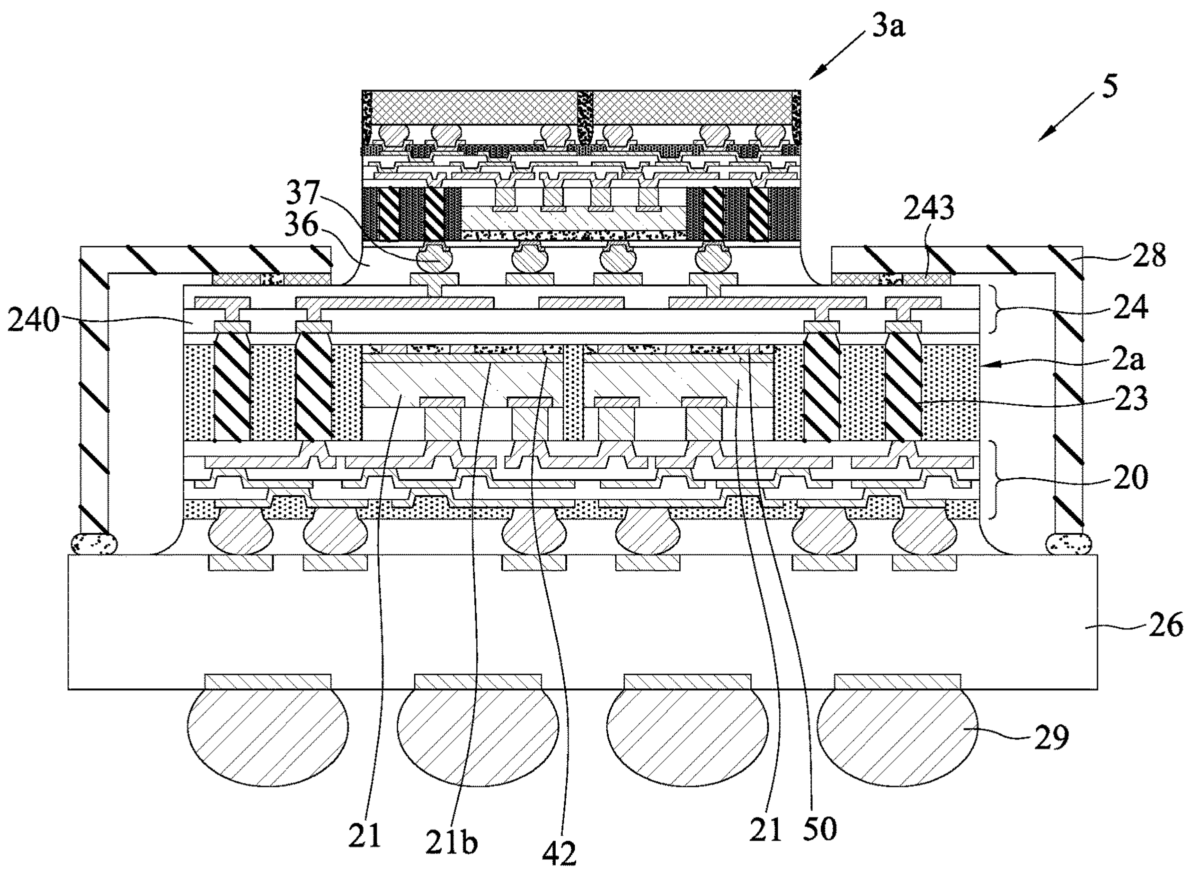

FIG. 5A to FIG. 5C are schematic cross-sectional views illustrating a method of manufacturing an electronic package 5 according to a fourth embodiment the present disclosure. The difference between the fourth embodiment and the third embodiment lies in the composition of the composite material, so the same points will not be repeated below.

As shown in FIG. 5A to FIG. 5B, in the process shown in FIG. 2A, the inactive surface 21*b* of the electronic element 21 is bonded onto the insulating layer 91 by a composite material (e.g., a bonding layer 52, a plurality of heat dissipation blocks 50 and a metal layer 42).

In an embodiment, the bonding layer 52 is a non-conductive film (NCF), and the heat dissipation blocks 50 are embedded in the bonding layer 52, so that the heat dissipation blocks 50 are in contact with the metal layer 42 on the inactive surface 21*b*. For example, a metal layer 42 is firstly sputtered on the inactive surface 21*b* of the electronic element 21, then a bonding layer 52 is adhered on the metal layer 42, and a plurality of heat dissipation blocks 50 are formed on the insulating layer 91 (as shown in FIG. 5A), so that the electronic element 21 is pressed on the heat dissipation blocks 50 by the bonding layer 52, such that the bonding layer 52 covers the heat dissipation blocks 50 (as shown in FIG. 5B).

Figure 5D:
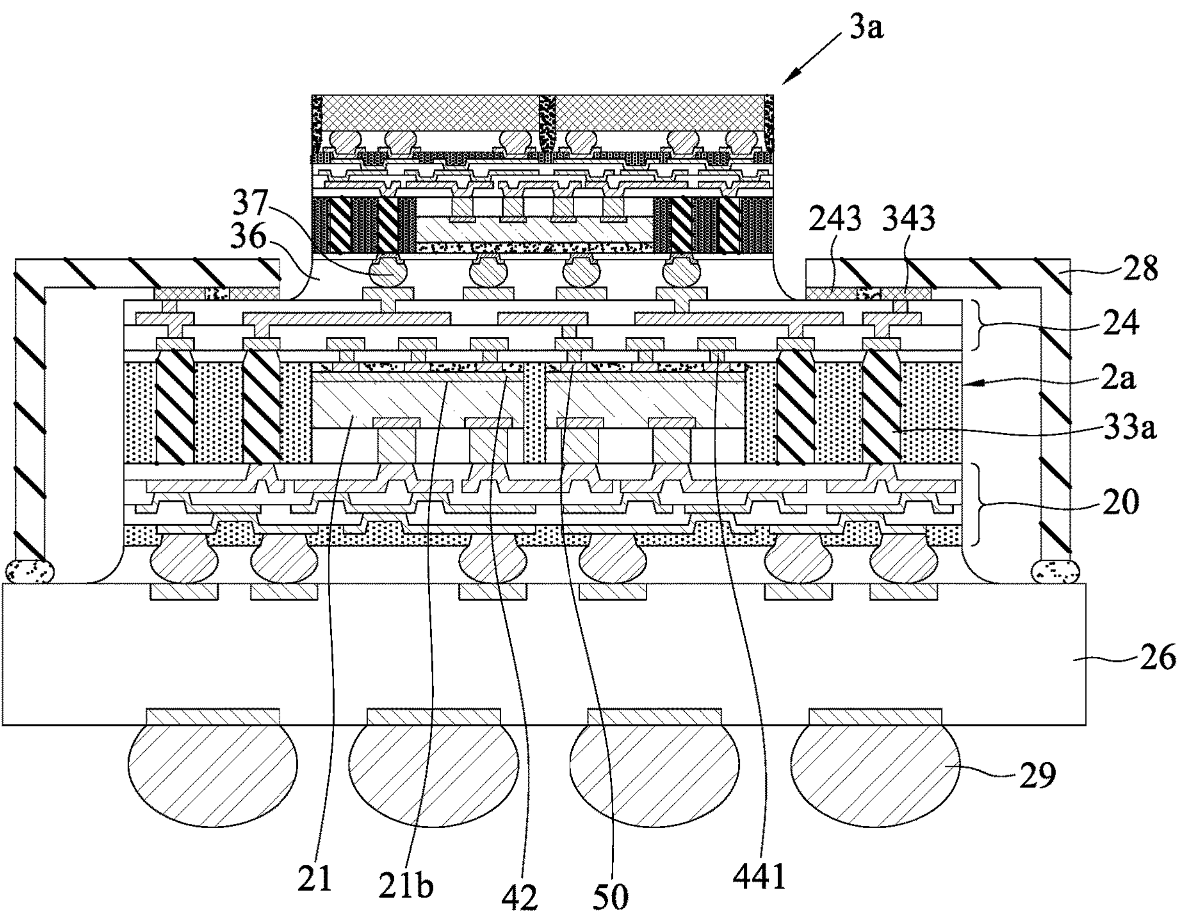
FIG. 5D is a schematic cross-sectional view corresponding to another embodiment of FIG. 5B to FIG. 5C.

As shown in FIG. 5C, in the subsequent process, the routing structure 24 is in contact with the heat dissipation blocks 50 via the insulating layer 91 (or the grounding line 441 as shown in FIG. 5D), so that the heat dissipation path of the electronic element 21 can pass through the inactive surface 21*b*, the metal layer 42, the heat dissipation blocks 50, the insulating layer 91 (or the grounding line 441), the heat dissipation pads 243, 343, the heat dissipation member 28 (or the conductive pillars 33*a*), the circuit structure 20 and the carrier structure 26.

Therefore, in the manufacturing method of the embodiment, the heat dissipation blocks 50 are added on the inactive surface 21*b* of the electronic element 21 to enhance the heat dissipation effect of the electronic element 21 (backside), and the heat dissipation blocks 50 can be further connected to the grounding line 441 of the routing structure 24, so that the path that heat is dissipated to the heat dissipation pads 243 and 343 via the metal layer 42 and the heat dissipation blocks 50 is a high heat dissipation metal path, so the heat dissipation effect is better.

The present disclosure also provides an electronic package 2, 3, 4, 5, comprising: a carrier structure 26, a package module 2*a*, a heat dissipation member 28, and an electronic module 3*a*.

The package module 2*a* is stacked on the carrier structure 26 via a plurality of conductive elements 27 and includes a cladding layer 25, at least one electronic element 21 and a plurality of conductive pillars 23, 33*a* embedded in the cladding layer 25, and a routing structure 24 formed on the cladding layer 25, so that the plurality of conductive elements 27 and the routing structure 24 are respectively disposed on opposite sides of the cladding layer 25, and the electronic element 21 and the plurality of conductive pillars 23, 33*a* are electrically connected to the carrier structure 26 via the plurality of conductive elements 27, and the routing structure 24 is electrically connected to the plurality of conductive pillars 23, 33*a*, wherein the routing structure 24 has at least one heat dissipation pad 243, 343.

The heat dissipation member 28 is disposed on the heat dissipation pads 243, 343 and bonded to the carrier structure 26, so that the heat dissipation member 28 covers a part of the surface of the routing structure 24.

The electronic module 3*a* is disposed onto another part of the surface of the routing structure 24 and is electrically connected to the routing structure 24.

In one embodiment, the heat dissipation pads 243 are dummy pads free from having electrical function.

In one embodiment, the routing structure 24 has a grounding line 341, so that the heat dissipation pads 343 serve as ground pads connected to the grounding line 341.

In one embodiment, the routing structure 24 has a plurality of the heat dissipation pads 243, 343, and the arrangement of the heat dissipation pads 243, 343 is in a ring shape, and the heat dissipation member 28 has a ring body 28*a* bonded with the plurality of heat dissipation pads 243, 343, wherein the ring body 28*a* has an opening 280, so that another part of the surface of the routing structure 24 is exposed from the opening 280, such that the electronic module 3*a* is disposed on the routing structure 24 in the opening 280 to electrically connect the routing structure 24. For example, a heat dissipation material 281 is disposed between the ring body 28*a* and the heat dissipation pads 243, 343. Further, the plurality of heat dissipation pads 243, 343 of the routing structure 24 surround the opening 280 to serve as a retaining wall, and the plurality of heat dissipation pads 243, 343 of the routing structure 24 are arranged in multiple rings to define an inner ring 243*a* and an outer ring 243*b*, for limiting the arrangement range of the heat dissipation material 281.

In one embodiment, a metal layer 42 is disposed between the electronic element 21 and the routing structure 24. For example, the metal layer 42 is in contact with the routing structure 24. Alternatively, the routing structure 24 has a grounding line 441 to connect the metal layer 42.

In one embodiment, the electronic package 2 further includes at least one heat dissipation structure 39 disposed on the electronic module 3*a*.

To sum up, in the electronic package and the manufacturing method thereof according to the present disclosure, the routing structure between the electronic module and the package module is configured with at least one heat dissipation pad for docking the heat dissipation member, so as to facilitate the heat dissipation of the electronic module and the package module. Therefore, the heat energy of the electronic module and the package module can be dissipated to the external environment via the contact of the heat dissipation member with the heat dissipation pad.

Therefore, the heat dissipation member is directly disposed above the conductive pillars and the routing structure, not only the heat dissipation path is reduced (or the heat dissipation is fast), but also the heat dissipation effect can be improved via the heat dissipation pads and the heat dissipation member that are of metal materials.

The foregoing embodiments are provided for the purpose of illustrating the principles and effects of the present disclosure, rather than limiting the present disclosure. Anyone skilled in the art can modify and alter the above embodiments without departing from the spirit and scope of the present disclosure. Therefore, the scope of protection with regard to the present disclosure should be as defined in the accompanying claims listed below.

What is claimed is:

1. An electronic package, comprising:

a carrier structure;

a package module stacked on the carrier structure via a plurality of conductive elements and including a cladding layer, at least one electronic element and a plurality of conductive pillars embedded in the cladding layer, and a routing structure formed on the cladding layer, wherein the plurality of conductive elements and the routing structure are respectively disposed on opposite sides of the cladding layer, wherein the at least one electronic element and the plurality of conductive pillars are electrically connected to the carrier structure via the plurality of conductive elements, and the routing structure is electrically connected to the plurality of conductive pillars, and wherein the routing structure has at least one heat dissipation pad;

a heat dissipation member having a ring body and a plurality of supporting legs extending downward from the ring body, wherein the ring body of the heat dissipation member is disposed on the at least one heat dissipation pad, the plurality of supporting legs of the heat dissipation member are bonded to the carrier structure, the ring body of the heat dissipation member only covers a part of a surface of the routing structure, and another part of the surface of the routing structure is exposed from the ring body; and at least one electronic module disposed on the another part of the surface of the routing structure exposed from an opening of the ring body of the heat dissipation member and electrically connected to the routing structure, wherein the plurality of conductive elements, the cladding layer, the at least one electronic element, and the routing structure having the at least one heat dissipation pad are positioned below the opening of the ring body of the heat dissipation member, the at least one electronic module is positioned above the opening of the ring body of the heat dissipation member and the routing structure having the at least one heat dissipation pad, the opening of the ring body of the heat dissipation member is positioned between the routing structure having the at least one heat dissipation pad and the at least one electronic module, and the plurality of conductive elements, the cladding layer, the at least one heat dissipation pad of the routing structure, the ring body of the heat dissipation member, and the at least one electronic module are sequentially positioned above the carrier structure.

2. The electronic package of claim 1, wherein the at least one heat dissipation pad is a dummy pad free from having electrical function.

3. The electronic package of claim 1, wherein the routing structure has a grounding line, such that the at least one heat dissipation pad serves as a ground pad connected to the grounding line.

4. The electronic package of claim 1, wherein the routing structure has a plurality of the heat dissipation pads arranged in a ring shape, and the ring body is bonded with the plurality of heat dissipation pads, and wherein the another part of the surface of the routing structure is exposed from the opening, and the at least one electronic module is disposed on the routing structure in the opening to electrically connect the routing structure.

5. The electronic package of claim 4, wherein the ring body and the plurality of heat dissipation pads have a heat dissipation material disposed therebetween.

6. The electronic package of claim 5, wherein the plurality of heat dissipation pads surround the opening to serve as a retaining wall for preventing the heat dissipation material from overflowing to an area of the opening.

7. The electronic package of claim 6, wherein the plurality of heat dissipation pads are arranged in multiple rings, and an inner ring and an outer ring are defined according to a distance from the opening, and wherein one of the multiple rings closest to the opening is used as the inner ring, and one of the multiple rings farthest from the opening is used as the outer ring, for limiting an arrangement range of the heat dissipation material between the inner ring and the outer ring.

8. The electronic package of claim 1, wherein the at least one electronic element and the routing structure have a metal layer formed therebetween.

9. The electronic package of claim 8, wherein the metal layer is in contact with the routing structure.

10. The electronic package of claim 8, wherein the routing structure has a grounding line to connect the metal layer.

11. The electronic package of claim 1, further comprising a heat dissipation structure disposed on the at least one electronic module.

12. A method of manufacturing an electronic package, comprising:

providing a package module including a cladding layer, at least one electronic element and a plurality of conductive pillars embedded in the cladding layer, and a routing structure formed on the cladding layer, wherein the routing structure is electrically connected to the plurality of conductive pillars, and wherein the routing structure has at least one heat dissipation pad;

stacking the package module on a carrier structure via a plurality of conductive elements, wherein the plurality of conductive elements and the routing structure are respectively located on opposite sides of the cladding layer, and wherein the at least one electronic element and the plurality of conductive pillars are electrically connected to the carrier structure via the plurality of conductive elements;

disposing a ring body of a heat dissipation member on the at least one heat dissipation pad, and bonding a plurality of supporting legs of the heat dissipation member extended downward from the ring body to the carrier structure, wherein the ring body of the heat dissipation member only covers a part of a surface of the routing structure, and another part of the surface of the routing structure is exposed from the ring body; and disposing at least one electronic module on the another part of the surface of the routing structure exposed from an opening of the ring body of the heat dissipation member, wherein the at least one electronic module is electrically connected to the routing structure, the plurality of conductive elements, the cladding layer, the at least one electronic element, and the routing structure having the at least one heat dissipation pad are positioned below the opening of the ring body of the heat dissipation member, the at least one electronic module is positioned above the opening of the ring body of the heat dissipation member and the routing structure having the at least one heat dissipation pad, the opening of the ring body of the heat dissipation member is positioned between the routing structure having the at least one heat dissipation pad and the at least one electronic module, and the plurality of conductive elements, the cladding layer, the at least one heat dissipation pad of the routing structure, the ring body of the heat dissipation member, and the at least one electronic module are sequentially positioned above the carrier structure.

13. The method of claim 12, wherein the at least one heat dissipation pad is a dummy pad free from having electrical function.

14. The method of claim 12, wherein the routing structure has a grounding line, such that the at least one heat dissipation pad serves as a ground pad connected to the grounding line.

15. The method of claim 12, wherein the routing structure has a plurality of the heat dissipation pads arranged in a ring shape, and the ring body is bonded with the plurality of heat dissipation pads, and wherein the another part of the surface of the routing structure is exposed from the opening, and the at least one electronic module is disposed on the routing structure in the opening to electrically connect the routing structure.

16. The method of claim 15, wherein the ring body and the plurality of heat dissipation pads have a heat dissipation material disposed therebetween.

17. The method of claim 16, wherein the plurality of heat dissipation pads surround the opening to serve as a retaining wall for preventing the heat dissipation material from overflowing to an area of the opening.

18. The method of claim 17, wherein the plurality of heat dissipation pads are arranged in multiple rings, and an inner ring and an outer ring are defined according to a distance from the opening, and wherein one of the multiple rings closest to the opening is used as the inner ring, and one of the multiple rings farthest from the opening is used as the outer ring, for limiting an arrangement range of the heat dissipation material between the inner ring and the outer ring.

19. The method of claim 12, wherein the at least one electronic element and the routing structure have a metal layer formed therebetween.

20. The method of claim 19, wherein the metal layer is in contact with the routing structure.

21. The method of claim 19, wherein the routing structure has a grounding line to connect the metal layer.

22. The method of claim 12, further comprising disposing a heat dissipation structure on the at least one electronic module.

* * * * *